United States Patent
Osanai

[11] Patent Number: 6,146,945
[45] Date of Patent: Nov. 14, 2000

[54] METHOD FOR MANUFACTURING A SEMICONDUCTOR DEVICE

[75] Inventor: Jun Osanai, Chiba, Japan

[73] Assignee: Seiko Instruments Inc., Japan

[21] Appl. No.: 09/235,673

[22] Filed: Jan. 22, 1999

[30] Foreign Application Priority Data

Jan. 30, 1998 [JP] Japan .................................. 10-018424
Jun. 3, 1998 [JP] Japan .................................. 10-154718

[51] Int. Cl.[7] .............................................. H01L 21/8247
[52] U.S. Cl. ............................................ 438/258; 438/264
[58] Field of Search ..................................... 438/257–267

[56] References Cited

U.S. PATENT DOCUMENTS 5,970,338 10/1999 Tempel ..................................... 438/241
5,981,342 11/1999 Kakoschke et al. ..................... 438/266

*Primary Examiner*—Richard Booth
*Attorney, Agent, or Firm*—Adams & Wilks

[57] ABSTRACT

The object is to provide a method for manufacturing a semiconductor device that is high in accuracy and function at low cost. In a semiconductor device having a resistance body and a non-volatile memory, by a manufacturing method to form a non-volatile memory select gate and floating gate with first polysilicon comparatively thick in film thickness and to form a non-volatile memory control gate and a resistance body with second polysilicon comparatively thin in film thickness, it is charactrized in that a non-volatile memory small in cell size and a highly accurate and stable resistance body can be simultaneously provided.

4 Claims, 5 Drawing Sheets

METHOD FOR MANUFACTURING A SEMICONDUCTOR DEVICE

BACKGROUND OF THE INVENTION

The present invention relates to semiconductor devices and, more particularly, to a method for manufacturing a semiconductor device having a resistance circuit and a non-volatile memory.

FIG. 5 and FIG. 6 show sectional views of a conventional semiconductor device. In FIG. 5, an electrically erasable programmable read only memory (hereinafter abbreviated as EEPROM) and a resistance body are structured by one layer of polysilicon. In FIG. 6, an EEPROM is structured by one layer of polysilicon and a resistance body is structured by a diffusion layer.

In the above-described conventional semiconductor device, the EEPROM is structured by one layer of polysilicon. In particular, because its control gate is formed by a diffusion layer, there is defect that the cell size is large and high integration is difficult. Also, where the resistance body is structured by polysilicon as in FIG. 5, this polysilicon serves also as a gate electrode of the MOS transistor so that the film thickness is comparatively thick of from 3000 Angstroms to 5000 Angstroms. Accordingly, there is defect that it is difficult to increase the resistance while keeping high accuracy. Also, where the resistance body is structured by a diffusion layer as in FIG. 6, the parasitic capacitance between it and the substrate is greater in comparison with the case of the polysilicon. Further, the voltage applied to the resistance body varies the extension of a depletion layer width toward the diffusion layer, and there is a problem that the resistance value possesses voltage dependency.

It is an object of the present invention to eliminate the above-stated problem and provide a manufacturing method to form at the same time an EEPROM small in cell size and a resistance body with accuracy and stability on a same substrate.

SUMMARY OF THE INVENTION

In order to solve the above-stated problem, the present invention employed the following means.

(1) A method for manufacturing a semiconductor device, comprising a step of forming a first diffusion layer of an opposite conductivity type in a semiconductor substrate, a step of forming a first insulation film on the semiconductor substrate, a step of removing part of the first insulation film on the first diffusion layer, a step of forming a second insulation film thinner than the first insulation film at a portion removing the first insulation film, a step of forming a first polysilicon film, a step of doping an impurity at a concentration of $1 \times 10^{19}$ atoms/cm$^3$ or higher to the first polysilicon film, a step of patterning the first polysilicon film, a step of forming a second diffusion layer of the opposite conductivity type in the semiconductor substrate, a step of forming a third insulation film in a surface of the semiconductor substrate including the upside of region of the first polysilicon film, a step of forming a second polysilicon film of 100 Angstroms to 1500 Angstroms on the third insulation film, a step of doping an impurity at $1 \times 10^{15}$–$5 \times 10^{19}$ atoms/cm$^3$ to the second polysilicon film, a step of patterning the second polysilicon film, a step of doping an impurity at $1 \times 10^{19}$ atoms/cm$^3$ or higher to part or entire of the second polysilicon film, and a step of forming a third diffusion layer of the opposite conductivity type in the semiconductor substrate.

(2) A method of manufacturing a semiconductor device characterized in that the step of doping an impurity at $1 \times 10^{19}$ atoms/cm$^3$ or higher to part or entire of the second polysilicon film and the step of forming the third diffusion layer of the opposite conductivity type in the semiconductor substrate are simultaneously performed.

(3) A method of manufacturing a semiconductor device characterized in that the first polysilicon has a film thickness of 3000 Angstroms to 5000 Angstroms, the first polysilicon being an N-type of conductivity type, and the first polysilicon has a sheet resistance of 10 Ω/ to 50 Ω/.

(4) A method of manufacturing a semiconductor device characterized in that a sidewall insulation film is provided on a lateral wall of the first polysilicon patterned.

DETAILED DESCRIPTION

An embodiment of the present invention will be explained hereinbelow based on the drawings.

Figure 1:
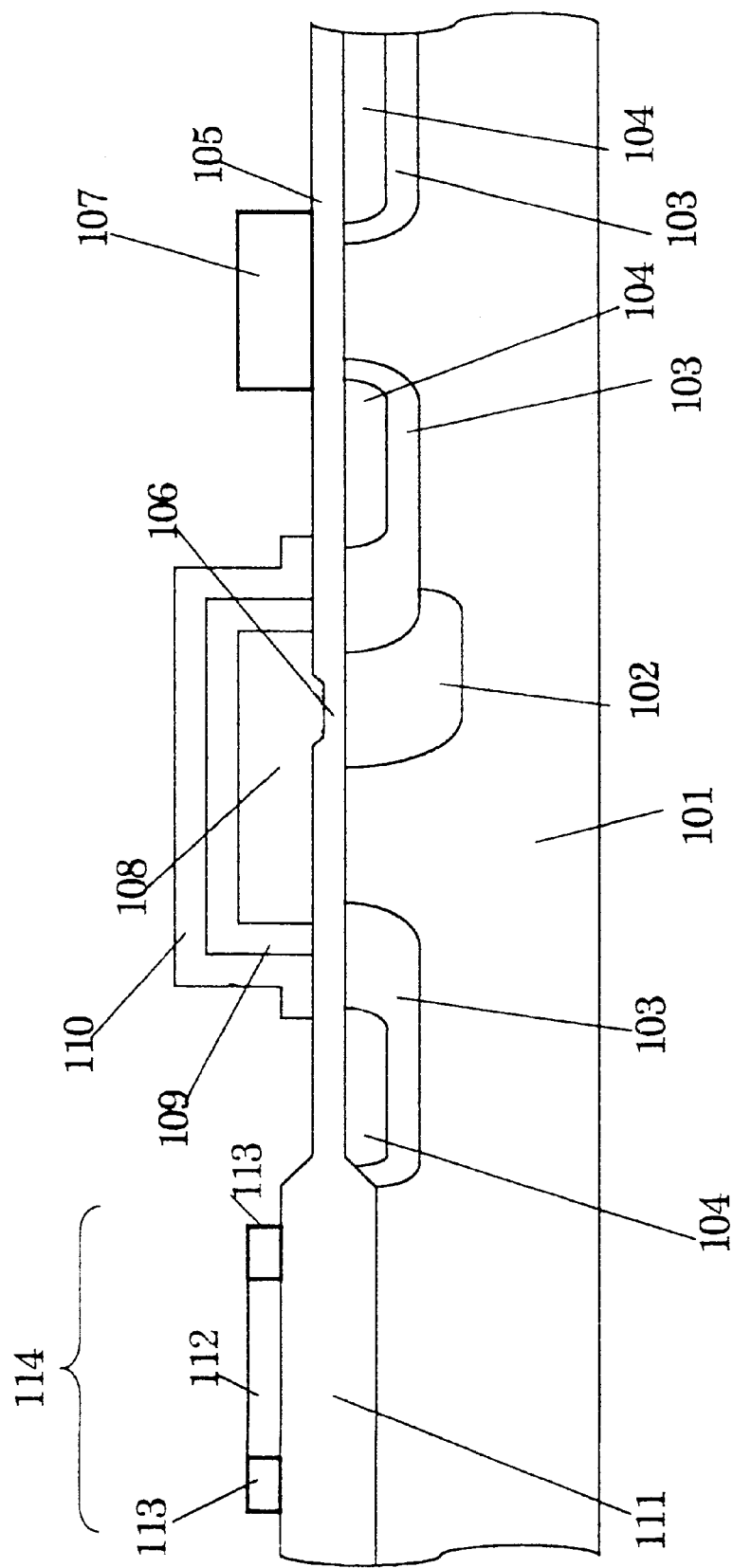
FIG. 1 is a typical sectional view showing one embodiment of a semiconductor device of the present invention.

FIG. 1 is a typical sectional view showing one embodiment of a semiconductor device of the present invention. In a semiconductor substrate 101, diffusion layers 102, 103 and 104 opposite in conductivity type to the substrate are formed. On the semiconductor substrate 101, a gate dielectric film 105 and a tunnel insulation film 106 are provided. On these dielectric film, a select gate 107 and a floating gate 108 are formed of first polysilicon. Further on the floating gate 108, a control gate 110 is formed of second polysilicon through an insulation film 109. Thus an EEPROM cell comprising the above elements is formed.

On the other hand, on a field insulation film 111 a resistance body 114 is formed of the second polysilicon having a high resistance region 112 and a low resistance region 113.

In FIG. 1, the control gate 110 of the EEPROM is formed of the second polysilicon and is overlying the floating gate 108 formed of the first polysilicon, thus making possible to make the EEPROM cell size compact.

Further, the resistance body 114 is formed of the second polysilicon. By reducing the film thickness of this second polysilicon to 500 Angstroms to 1500 Angstroms that is thinner than the film thickness of 3000 Angstroms to 5000 Angstroms of the polysilicon used for usual gate electrodes or interconnections, it becomes possible to maintain the resistance value of the resistance body 114 high and accurate. Where the film thickness of the polysilicon is tick, there is necessity of reducing the concentration of an impurity introduced into the polysilicon in order to increase the resistance value. At this time, the resistance value becomes very sensitive to variation in impurity introducing devices and variation in polysilicon film thickness and crystal size.

On the other hand, where the film thickness of the polysilicon layer is thin, even if the concentration of an impurity introduced into the polysilicon is some high, it is possible to obtain comparatively high resistance value, e.g., a resistance value of approximately 10 kΩ/ in sheet resistance value. Accordingly, the variation in resistance value can be suppressed small.

Also, because the resistance body 114 is surrounded by the comparatively thick field insulation film 111 and inter-layer insulation film, it is less electrically affected by the surrounding interconnections and substrate, etc. and exhibits stable characteristics. In particular, it is effective for a case that voltage is divided by using the present resistance body 114.

FIG. 2 is a process sectional view showing a manufacturing method of the present invention.

Figure 2A:
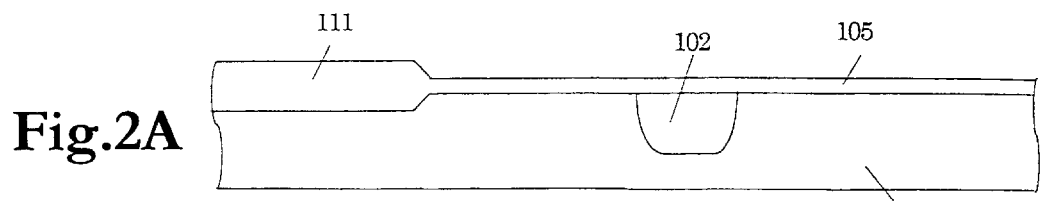
FIGS. 2(A)–2(E) are a process sectional view showing a manufacturing method for the semiconductor device of the present invention.

FIG. 2A illustrates a manner forming a tunnel drain 102 as a diffusion layer with an opposite conductivity type to the semiconductor substrate 101 by the photolithographic method and ion implant method after forming a gate insulation film 105 and a field insulation film 111 on the semiconductor substrate 101. The EEPROM is usually structured by an N-type MOS, and this tunnel drain 102 is formed by ion-implanting, for example, an arsenic ion at a dose of approximately $5 \times 10^{13}/cm^2$ to $5 \times 10^{14}/cm^2$. The similar effect is of course available if a phosphorus ion as an N-type impurity is used in place of arsenic.

Figure 2B:
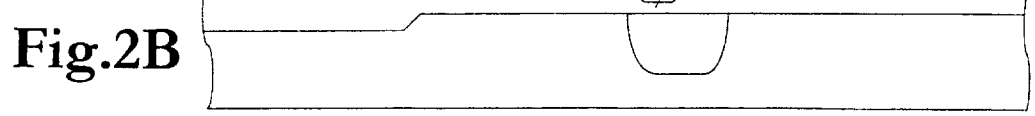

Then, as shown in FIG. 2B, a gate dielectric film 105 is selectively removed by the photolithography method and wet etching method and thereafter a tunnel insulation film 106 of approximately 100 Angstroms is formed on the tunnel drain 102 in a oxidation oven.

Figure 2C:
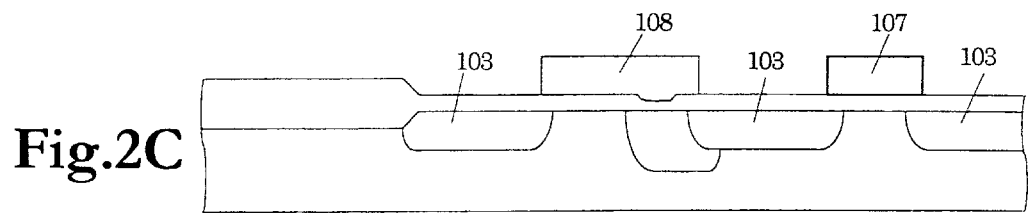

Then, as shown in FIG. 2(c), a first polysilicon is deposited in a film thickness of 3000 to 5000 Angstroms on the insulation film by the CVD method (chemical vapor deposition), and phosphorus atoms are introduced at $1 \times 10^{20}/cm^3$ into the first polysilicon in a diffusion furnace or by ion implant method, thus turning into an N-type. Thereafter a floating gate 108 and a select gate 107 are formed by patterning the first polysilicon using the photolithography method and dry etching method, and further an N-type low-concentration diffusion layer 103 is formed by the photolithography method and the ion implant method. This N-type low-concentration diffusion layer 103 is a diffusion layer required for relaxing the electric field so as to withstand a voltage of around 20 V applied to the cell during write or erasure in the EEPROM, and accordingly formed using, for example, phosphorus atoms or arsenic atoms at a comparatively low dose of $1 \times 10^{13}/cm^2$ to $5 \times 10^{14}/cm^2$. Further, there is a case that diffusion is performed in a diffusion oven after ion-implanting, in order to increase the effect of electric field relaxation.

Figure 2D:
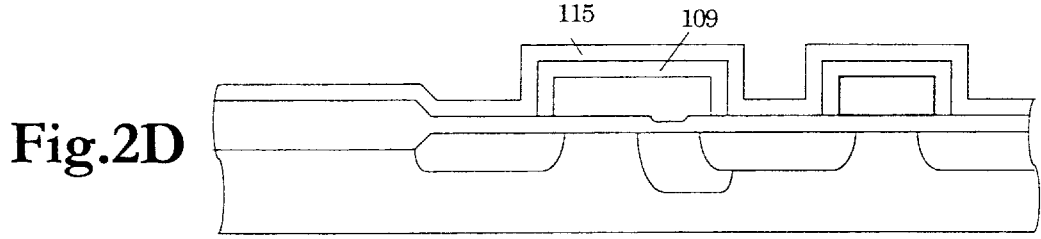

Then, as shown in FIG. 2D, an insulation film 109 is formed on the first polysilicon, and thereafter a second polysilicon is deposited in a film thickness of 500 Angstroms to 1500 Angstroms on the insulation film by the CVD method. This insulation film 109 is formed by a method of oxidizing the first polysilicon or a method of depositing an oxide film or nitride film on the first polysilicon by the CVD method, or a combination of these methods.

In order to increase the efficiency in EEPROM writing or erasure, there is a necessity of increasing the capacitance coupling ratio of so-called a floating gate 108 and a control gate formed thereafter as large as possible. Usually, the capacitance of this insulation film 109 is made at 200 Angstroms to 900 Angstroms or equivalent in terms of oxide film.

Figure 2E:
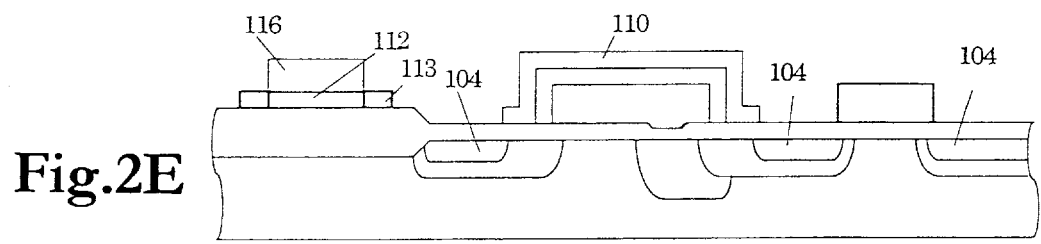

Then, as shown in FIG. 2E, an impurity is introduced into the second polysilicon by the ion implant method so as to obtain a desired resistance value of the resistance body. Thereafter, the second polysilicon is patterned by the photolithography method and the dry etching method to form a control gate 110 and a resistance body 114. In order to reduce the resistance of the control gate 110 and to form a low resistance region 113 in the resistance body 114 and further a high-concentration diffusion layer 104, photoresist is patterned to selectively introduce an impurity into the second polysilicon and the semiconductor substrate 101. The impurity introduced in a high resistance region 112 of the resistance body 114 is for example a use of phosphorus atoms at a dose of approximately $5 \times 10^{14}/cm2$, thereby becoming a value around a sheet resistance value 10 kΩ/. The similar effect is of course obtained if arsenic atoms is used in place of phosphorus atoms. Also, where the resistance body 114 is made in a resistance body of a P-type instead of the N-type, boron or BF2 ions may be introduced. However, where a P-type resistance body is formed, the low resistance region 113 has to be made in the P-type. At this time, it is impossible to simultaneously perform the resistance reduction in the control gate 110 and the formation of the EEPROM high-concentration diffusion layer 104 and the formation of the low resistance region 113. The resistance reduction in the control gate 110 and the EEPROM high-concentration diffusion layer 104 and further the low resistance region 113 where the resistance body 114 is in the N-type are formed by ion-implant using, for example, an arsenic ion at a dose of $1 \times 10^{15}/cm^2$ to $1 \times 10^{16}/cm^2$. Also, if the semiconductor is CMOS, the formation of the low resistance region 113 for the P-type of the resistance body 114 makes possible its simultaneous formation with a source and drain of a PMOS thereof. This is achieved by using, for example, a BF2 ion at a dose of approximately $5 \times 10^{15}/cm^2$.

FIG. 3 is a process sectional view showing another manufacturing method of the present invention.

Figure 3A:
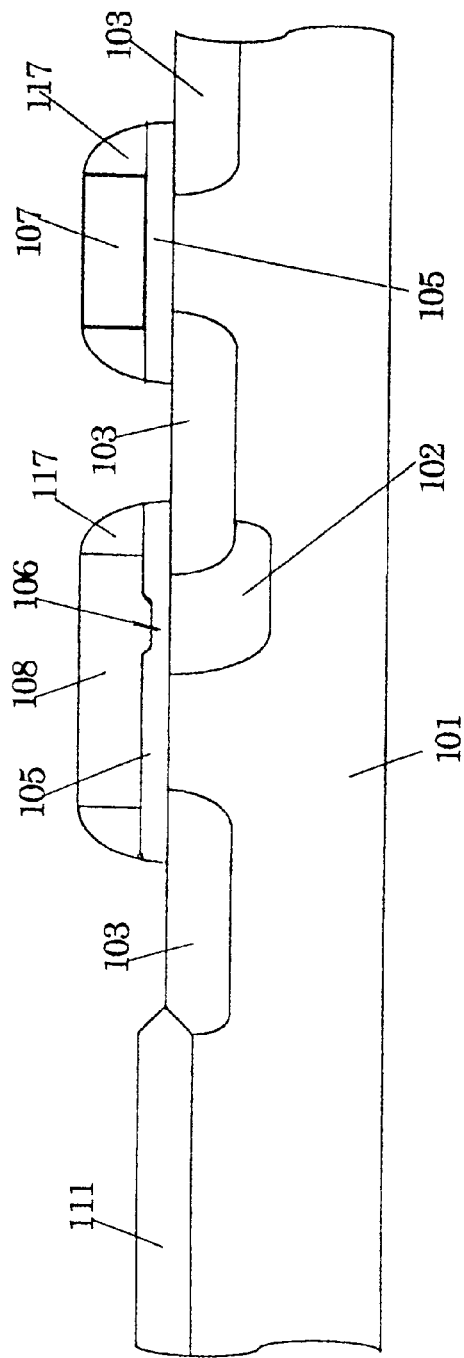
FIGS. 3(A)–3(B) are a process sectional view showing another manufacturing method for the semiconductor device of the present invention.

FIG. 3A shows a manner that on a semiconductor substrate 101 a gate insulation film 105, a tunnel insulation film 106, a field insulation film 111, a floating gate 108 and select gate 107 of first polysilicon are formed, and a tunnel drain 102 and low-concentration diffusion layer 103 are formed in the semiconductor substrate 101, and thereafter so-called side walls 117 are formed on lateral walls of the floating gate 108 and the select gate 107. The side walls 117 can be selectively formed on lateral walls of the patterned first polysilicon by depositing an insulation film at 2000 Angstroms to 6000 Angstroms, for example, by the CVD method and then etching it by an anisotropy dry etching method. Although a voltage of approximately 20 V is applied to the cell during writing or erasing in the EEPROM, there is a necessity of increasing an overlap amount of the low-concentration diffusion layer 103 with the high-concentration diffusion layer 104 in order to relax the electric field to withstand against the voltage. To do so, it is convenient to cause diffusion in the low-concentration diffusion layer 103 by thermal treatment. In such a case, the tunnel insulation film 106 may be impaired in film quality by so-called thermal budget. To form the sidewall 117 is effective so that the heat treatment is less carried out and the overlap amount with the high-concentration diffusion layer 104 is increased. Due to this, there is a case of employing a manufacturing method shown in FIG. 3.

Figure 3B:
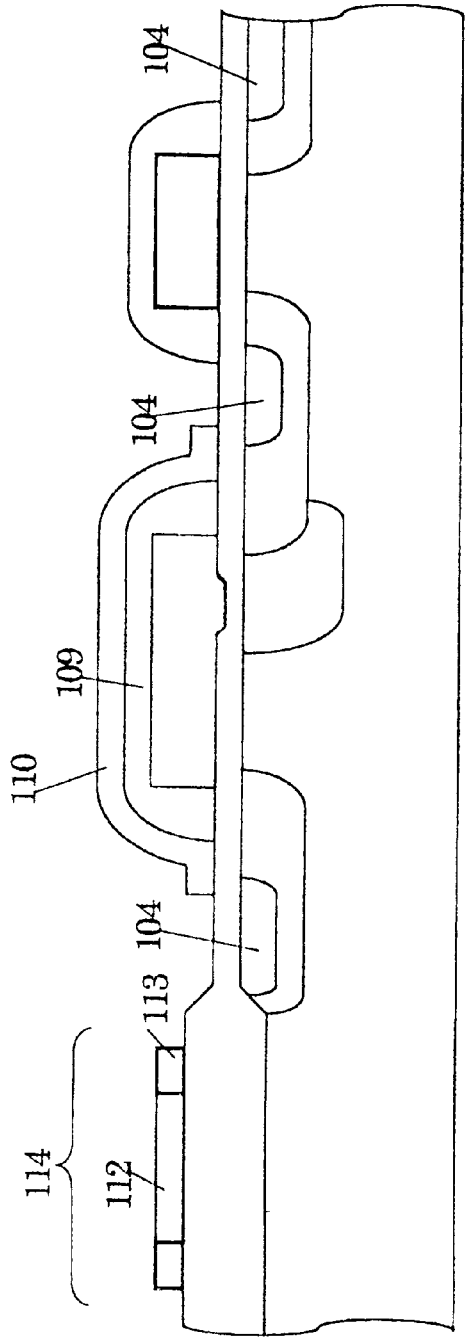

Then, as shown in FIG. 3B, a resistance body 114, a floating gate 110 and a high-concentration diffusion layer 104 are formed by an insulation film 109 and second polysilicon. These can be formed through a similar process to the manufacturing method as explained be using FIG. 2.

Then, an application example of the present invention will be explained by using FIG. 4.

Figure 4A:
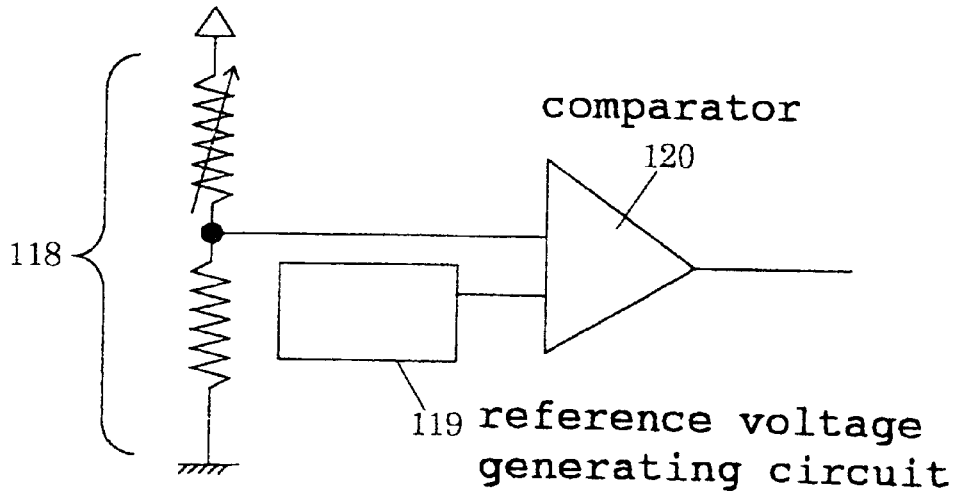
FIGS. 4(A)–4(B) are a view showing application examples of the present invention.

FIG. 4A shows so-called a voltage detecting circuit comprising a bleeder resistance circuit 118 for dividing voltage, a reference voltage generating circuit 119 for supplying a constant voltage and a comparator 120. This bleeder resistance circuit 118 is made variable so that a constant voltage can be detected at all times even if the reference voltage generating circuit 119 deviates in value on a manufacture lot basis and the difference in detection voltage setting value by a user can be coped with.

Figure 4B:
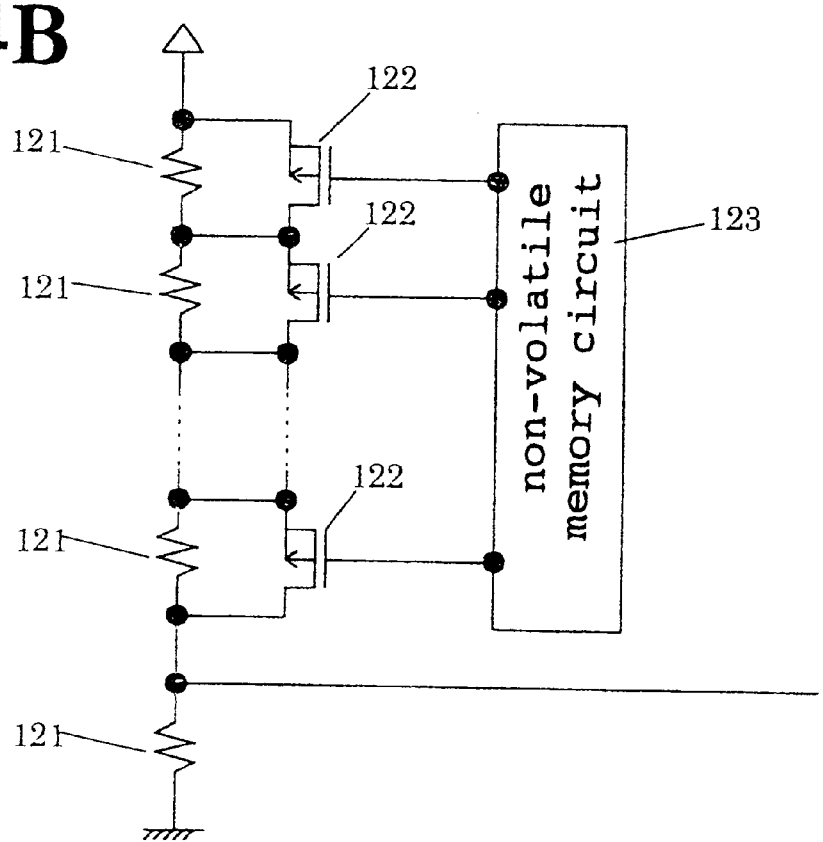
Figure 5:
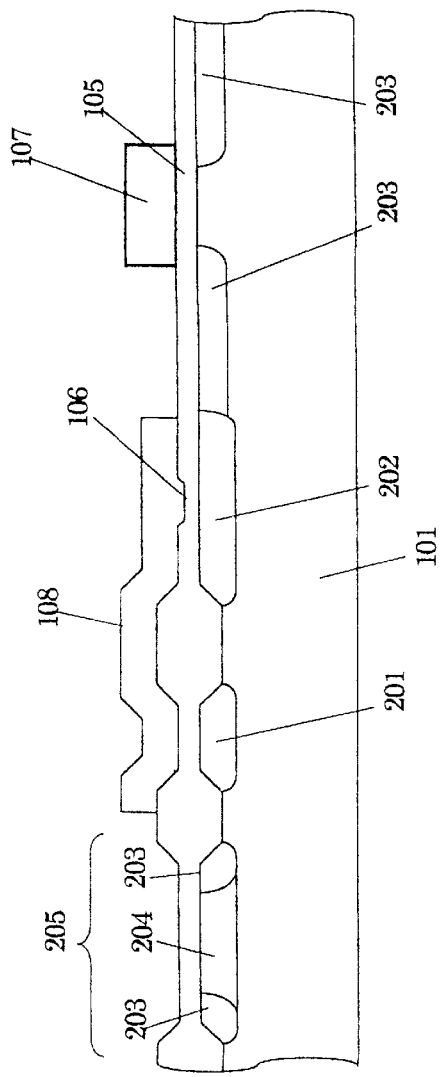
FIG. 5 is a typical sectional view showing an embodiment of a conventional semiconductor device.
Figure 6:
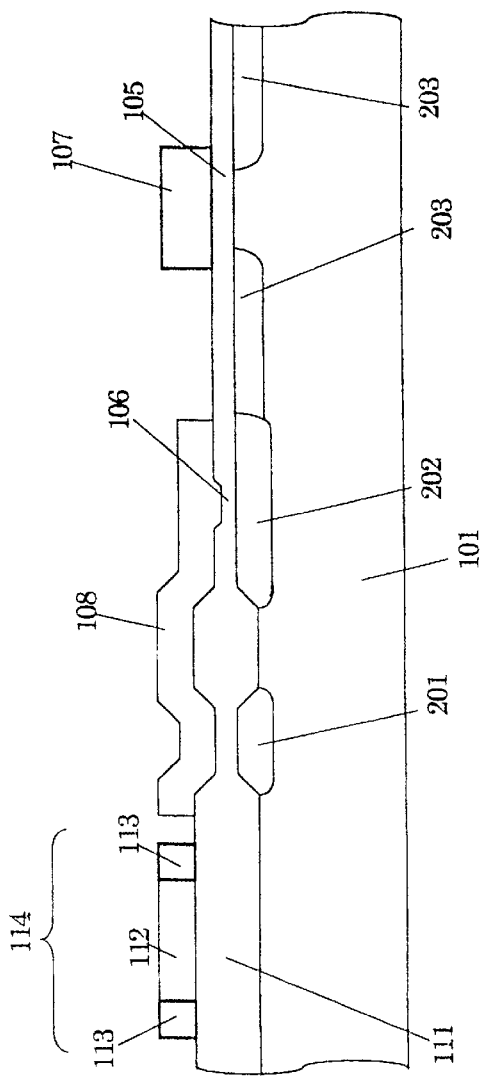
FIG. 6 is a typical sectional view showing another embodiment of the conventional semiconductor device.

FIG. 4B shows a bleeder resistance circuit to which the present invention is applied. MOS transistors 122 are built in parallel with resistance 121 so that input signals to the MOS transistors 122 are supplied from a non-volatile memory circuit 123. The structure as this makes possible to change the setting value a plurality of times. This resistance 121 uses a resistance body using second polysilicon according to the present invention, and the non-volatile memory circuit uses an EEPROM formed by the two-layer polysilicon of the present invention. Due to this, the resistance body is stable and highly accurate and the EEPROM cell is compact so that semiconductor devices with high resolution and high functionality can be supplied at low cost.

As stated above, according to the method for manufacturing a semiconductor device of the present invention, in a semiconductor device having a resistance body and a non-volatile memory, by forming a non-volatile memory select gate and floating gate with first polysilicon comparatively thick in film thickness and forming a non-volatile memory control gate and a resistance body with second polysilicon comparatively thin in film thickness, a non-volatile memory small in cell size and a highly accurate and stable resistance body can be simultaneously provided.

What is claimed is:

1. A method for manufacturing a semiconductor device, comprising a step of forming a first diffusion layer of an opposite conductivity type in a semiconductor substrate, a step of forming a first insulation film on said semiconductor substrate, a step of removing part of said first insulation film on said first diffusion layer, a step of forming a second insulation film thinner than said first insulation film at a portion where said first insulation film is removed, a step of forming a first polysilicon film, a step of doping an impurity at a concentration of $1 \times 10^{19}$ atoms/cm$^3$ or higher to said first polysilicon film, a step of patterning said first polysilicon film, a step of forming a second diffusion layer of the opposite conductivity type in said semiconductor substrate, a step of forming a third insulation film in a surface of said semiconductor substrate including the upper surface of said first polysilicon film, a step of forming a second polysilicon film of 100 Angstroms to 1500 Angstroms on said third insulation film, a step of doping an impurity at $1 \times 10^{15}$–$5 \times 10^{19}$ atoms/cm$^3$ to said second polysilicon film, a step of patterning said second polysilicon film, a step of doping an impurity at $1 \times 10^{19}$ atoms/cm$^3$ or higher to part or the entire said second polysilicon film, and a step of forming a third diffusion layer of the opposite conductivity type in said semiconductor substrate.

2. A method of manufacturing a semiconductor device as recited in claim 1, characterized in that the step of doping an impurity at $1 \times 10^{19}$ atoms/cm$^3$ or higher to part or the entire said second polysilicon film and the step of forming the third diffusion layer of the opposite conductivity type in said semiconductor substrate are simultaneously performed.

3. A method of manufacturing a semiconductor device as recited in claim 1, characterized in that said first polysilicon has a film thickness of 3000 Angstroms to 5000 Angstroms, said first polysilicon being an N-type of conductivity type, and said first polysilicon has a sheet resistance of 10 Ω/square to 50 Ω/square.

4. A method of manufacturing a semiconductor device as recited in claim 1, characterized in that a sidewall insulation film is provided on a lateral wall of said patterned first polysilicon film.

* * * * *